(12) United States Patent
Fang et al.

(10) Patent No.: US 10,273,329 B2
(45) Date of Patent: Apr. 30, 2019

(54) ORGANIC SEMICONDUCTOR POLYMER

(71) Applicants: Lei Fang, College Station, TX (US); Jongbok Lee, College Station, TX (US); Mohammed Al-Hashimi, Doha (QA)

(72) Inventors: Lei Fang, College Station, TX (US); Jongbok Lee, College Station, TX (US); Mohammed Al-Hashimi, Doha (QA)

( * ) Notice: Subject to any disclaimer, the term of this patent is extended or adjusted under 35 U.S.C. 154(b) by 221 days.

(21) Appl. No.: 15/457,975

(22) Filed: Mar. 13, 2017

(65) Prior Publication Data

US 2017/0260324 A1 Sep. 14, 2017

Related U.S. Application Data

(60) Provisional application No. 62/307,345, filed on Mar. 11, 2016.

(51) Int. Cl.
| | |
|---|---|
| *C08G 61/12* | (2006.01) |
| *C09K 11/06* | (2006.01) |
| *H01L 51/00* | (2006.01) |
| *H01L 51/42* | (2006.01) |
| *H01L 51/50* | (2006.01) |

(52) U.S. Cl.
CPC .......... *C08G 61/124* (2013.01); *C09K 11/06* (2013.01); *H01L 51/0035* (2013.01); *H01L 51/0044* (2013.01); *C08G 2261/1336* (2013.01); *C08G 2261/1412* (2013.01); *C08G 2261/3241* (2013.01); *C08G 2261/411* (2013.01); *C08G 2261/5222* (2013.01); *C08G 2261/72* (2013.01); *C08G 2261/91* (2013.01); *C08G 2261/95* (2013.01); *C09K 2211/1466* (2013.01); *H01L 51/42* (2013.01); *H01L 51/5012* (2013.01)

(58) Field of Classification Search
CPC .............. C08G 61/124; H01L 51/0044; C09K 2211/1466
See application file for complete search history.

(56) References Cited

U.S. PATENT DOCUMENTS

| | | | |
|---|---|---|---|
| 5,679,760 A | 10/1997 | Mullen et al. | |
| 6,833,432 B2 | 12/2004 | Leclerc et al. | |
| 8,053,547 B2 | 11/2011 | Parham et al. | |
| 8,686,104 B2 | 4/2014 | Du et al. | |
| 2003/0092880 A1* | 5/2003 | Leclerc | C08G 73/0672 528/422 |
| 2004/0079924 A1 | 4/2004 | Kwag et al. | |
| 2010/0063225 A1* | 3/2010 | Swager | C07C 41/16 526/72 |
| 2011/0251369 A1 | 10/2011 | Hwang et al. | |
| 2013/0237676 A1* | 9/2013 | Hsu | C07D 495/04 526/240 |

OTHER PUBLICATIONS

Cheng et al. (Chem. Mater. 2011, 23, 2361-2369) (Year: 2011).*
Cocherel et al., "The synthesis, physicochemical properties and anodic polymerization of a novel pentaphenylene" Dyes and Pigments (2009), vol. 83, pp. 339-347.
Lee et al., "Thermodynamic synthesis of solution processable ladder polymers", Chem. Sci., 2016, vol. 7, pp. 881-889, published online Nov. 6, 2015.
Lee et al., "Thermodynamic synthesis of solution processable ladder polymers", Electronic Supplementary Material for Chem. Sci., pp. S1-S39, published online Nov. 6, 2015 at DOI: 10.1039/c5sc02385h.

* cited by examiner

*Primary Examiner* — Liam J Heincer
(74) *Attorney, Agent, or Firm* — Richard C. Litman

(57) ABSTRACT

The organic semiconductor polymers relates to the synthesis of a carbazole-based ladder polymer. The synthesis of the ladder polymer includes forming a precursor conjugated polymer by Suzuki step growth polymerization of 2,7-dibromocarbazole with 1,4-dibromo-2,5-divinylbenzene, followed by end capping with 2-bromostyrene and 2-vinylphenylboronic acid. Then, the pendent vinyl groups are closed by ring-closing olefin metathesis to obtain the ladder polymer.

4 Claims, 5 Drawing Sheets

ORGANIC SEMICONDUCTOR POLYMER

CROSS-REFERENCE TO RELATED APPLICATION

This application claims the benefit of U.S. Provisional Patent Application Ser. No. 62/307,345, filed Mar. 11, 2016.

BACKGROUND OF THE INVENTION

1. Field of the Invention

The present invention relates to ladder polymers, and particularly to an organic semiconductor polymer that is a carbazole-based ladder polymer.

2. Description of the Related Art

By definition, ladder polymers have a distinctive architecture, whereby the chain consists of an uninterrupted sequence of rings, fused together in such a way that adjacent rings share two or more atoms in common, resulting in a constrained chain conformation. Possessing a backbone of fused aromatic rings, a fully conjugated ladder polymer is intrinsically free of possible torsional disorders that result from s-bond rotations in between the monomeric units. Without the interruption from these conformational disorders, as a result, the coherent p-conjugation length of a coplanar ladder backbone is much more extended. Such a well-defined conformation would afford a faster intra-chain charge/phonon transport, and a longer exciton diffusion length compared to conjugated polymers with free rotating torsional motions. This argument is further corroborated by the unparalleled electronic and thermal conductivity of graphene nanoribbons, which can be viewed as insoluble ladder polymers composed of only $sp^2$ carbon atoms. Combining the advantages of conventional polymeric materials such as solution processability and structural versatility, ladder polymers emerge as promising candidates for next-generation synthetic organic materials with breakthrough performances.

The synthesis of a well-defined ladder polymer, however, is a challenging task because of (i) the potential structural defects originated from moderately efficient ring-closing reactions, and (ii) the often poor solubility of structurally rigid intermediates or products. In an effort to overcome these obstacles, a highly efficient synthetic method and a rationally designed structural characteristic that enables solubility need to be achieved and integrated simultaneously.

Thus, an organic semiconductor polymer solving the aforementioned problems is desired.

SUMMARY OF THE INVENTION

The organic semiconductor polymer relates to the synthesis of a carbazole-based ladder polymer. The synthesis of the ladder polymer includes forming a precursor conjugated polymer by Suzuki step growth polymerization of 2,7-dibromocarbazole with 1,4-dibromo-2,5-divinylbenzene, followed by end capping with 2-bromostyrene and 2-vinylphenylboronic acid. Then, the pendent vinyl groups are closed by ring-closing olefin metathesis to obtain the ladder polymer. The ladder polymer has the formula:

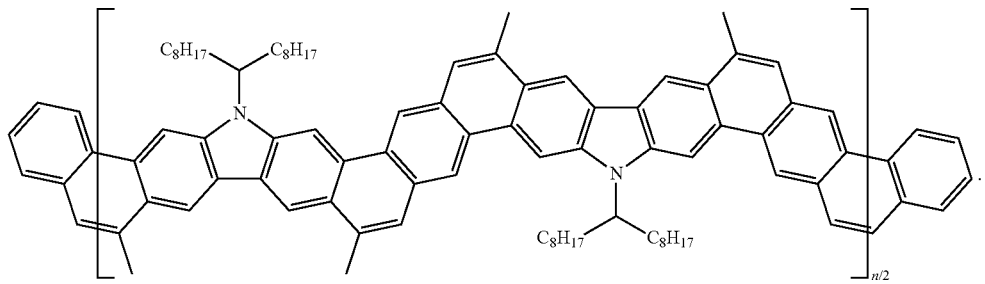

The ladder polymer is coplanar and fully conjugated. As with most carbazole-based compounds, the present ladder polymer is suitable for applications in photovoltaics and light emitting diodes.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The organic semiconductor polymer relates to the synthesis of a carbazole-based ladder polymer. The synthesis of the ladder polymer includes forming a precursor conjugated polymer by Suzuki step growth polymerization of 2,7-dibromocarbazole with 1,4-dibromo-2,5-divinylbenzene, followed by end capping with 2-bromostyrene and 2-vinylphenylboronic acid. Then, the pendent vinyl groups are closed by ring-closing olefin metathesis to obtain the ladder polymer. The ladder polymer has the formula:

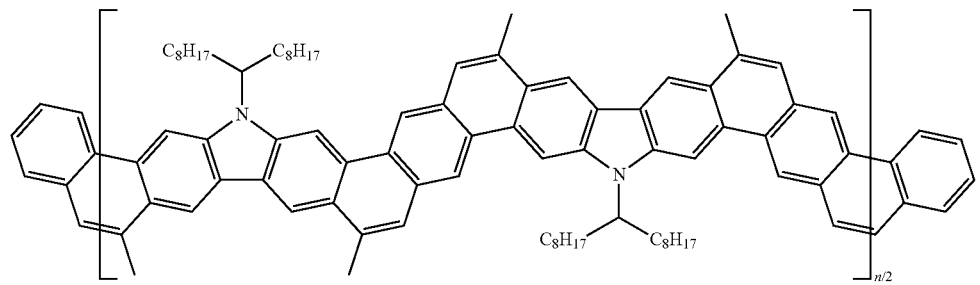

The ladder polymer is coplanar and fully conjugated. As with most carbazole-based compounds, the present ladder polymer is suitable for applications in photovoltaics and light emitting diodes.

The ring closing metathesis reaction was chosen for the synthesis of conjugated ladder polymers because (i) it can produce C=C double bonds by releasing about 28 kcal mol$^{-1}$ of enthalpy in forming a stable aromatic benzene ring; and (ii) its mild condition enables a wide substrate scope and excellent functional group tolerance. Given a properly designed precursor, RCM reactions should lead to an uncross-linked, stable, and conjugated ladder polymer with minimum unreacted defects.

Figure 1:
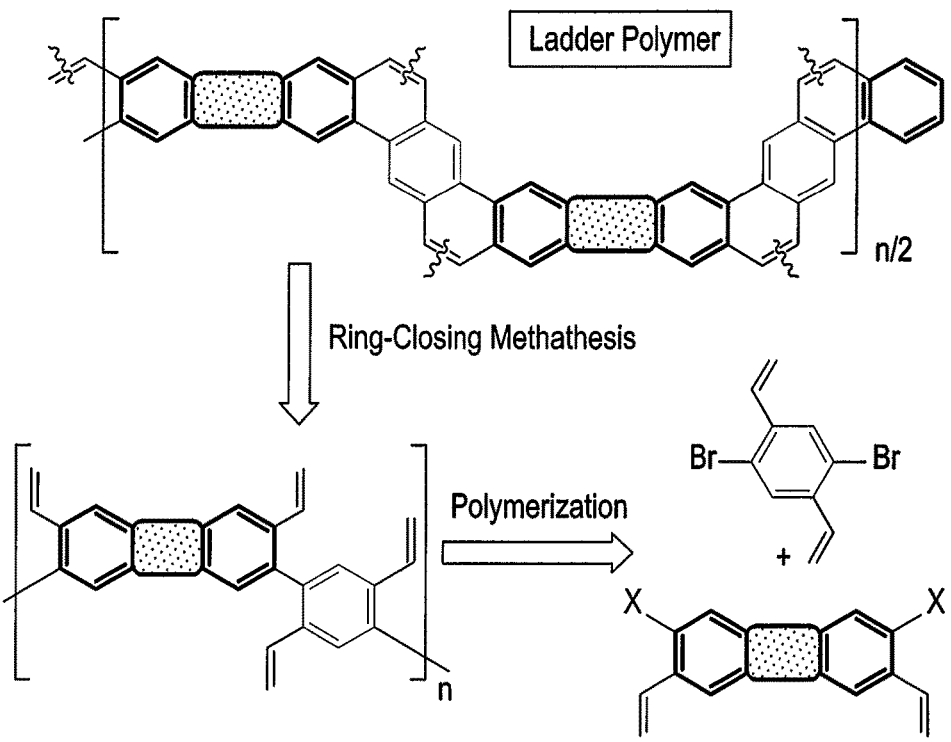
FIG. 1 is a schematic diagram showing the major steps of the synthesis of an organic semiconductor polymer according to the present invention in reverse.
Figure 2:
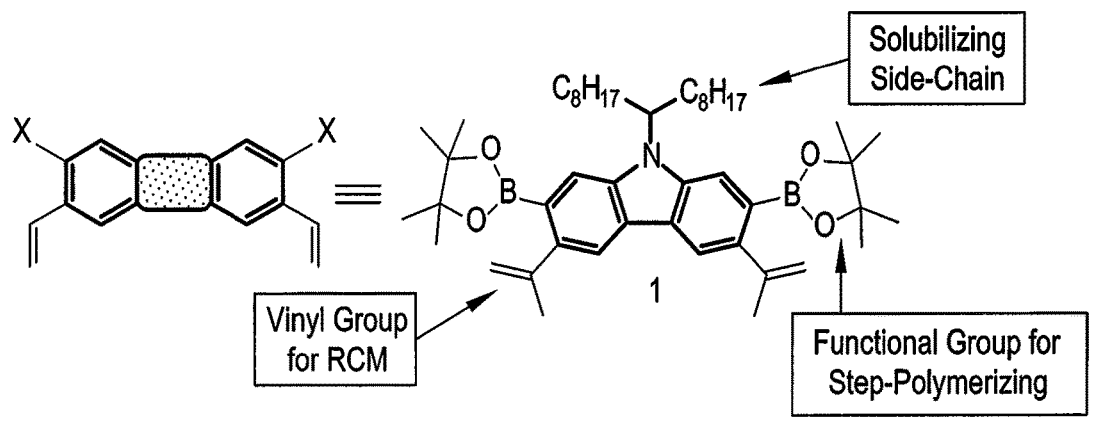
FIG. 2 is a diagram illustrating the structural formula of the monomer for an organic semiconductor polymer according to the present invention.

Guided by these principles, a synthetic route, shown in FIG. 1, was designed and executed. This synthesis involved two basic steps. First, step-growth polymerization of two divinyl-functionalized monomers affords a conjugated polymer with preorganized pendant vinyl groups. In the second step, the RCM reaction forms the bridging aromatic rings, and hence leads to a coplanar ladder polymer. A carbazole unit was employed as the primary building block in this design, as shown in FIG. 2, motivated by the following facts. First, it is inexpensive and feasible to prepare functionalized carbazole derivatives with excellent regioselectivity. For example, in the designed carbazole precursor 1, two boronic ester functions were installed on the 2,7-positions for the step-growth polymerization step, while the 3,6-positions were functionalized with vinyl groups for RCM annulation. Second, the presence of an easy-to-alkylate nitrogen position on the carbazole unit allows for the installation of an α-branched alkyl group (1-octylnonyl, in this case) to enhance the solubility of the rigid ladder polymer product.

Such a side-chain would extend in a perpendicular direction with respect to the π-system, so that solubility could be drastically enhanced by breaking the potentially too strong intermolecular π-π stacking interactions. Finally, carbazole-containing organic materials have demonstrated high performance in applications associated with photovoltaics and light emitting diodes. Thus, successful synthesis of ladder polymers derived from carbazole can be readily translated into applications in these fields.

Precursor 1 was synthesized from 2,7-dibromocarbazole in 60% overall yield on a 3 grams scale. Precursor 1 has the formula:

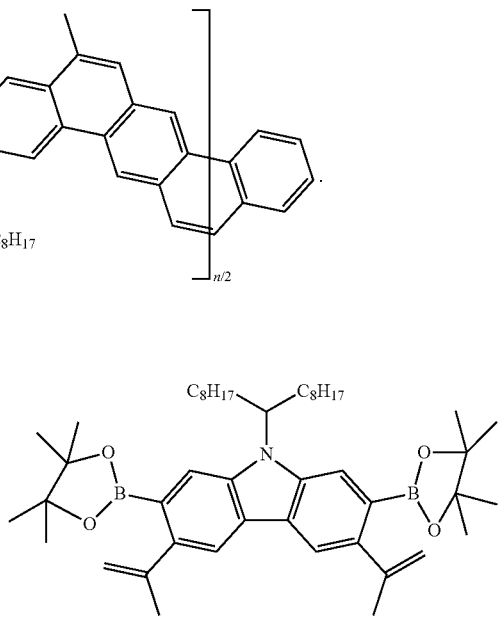

The synthesis of precursor 1 starts with the alkylated 2,7-dibromocarbazole of the formula:

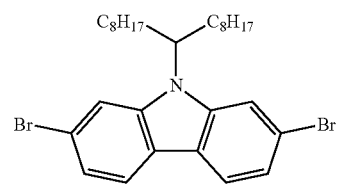

and is formally named 2,7-dibromo-9-(1-octylnonyl)-9H-carbazole. This starting compound is well known in the art, and is available commercially from chemical suppliers, or may be synthesized as described in Zhang et al., Macromolecules 2010, Vol. 43, p. 9376. Precursor 1 is obtained from the above starting compound by Friedel-Craft acylation with acetyl chloride to add acetyl groups to the 3 and 6 positions. The carbonyl groups are converted to alkene bonds by Wittig reaction with methyltriphenylphosphonium bromide to leave vinyl groups at the 3 and 6 positions, and the resulting compound is treated with 2-isopropoxy-4,4,5,5-tetramethyl-1,3,2-dioxaborolane in the presence of n-BuLi to obtain precursor 1.

Figure 3:
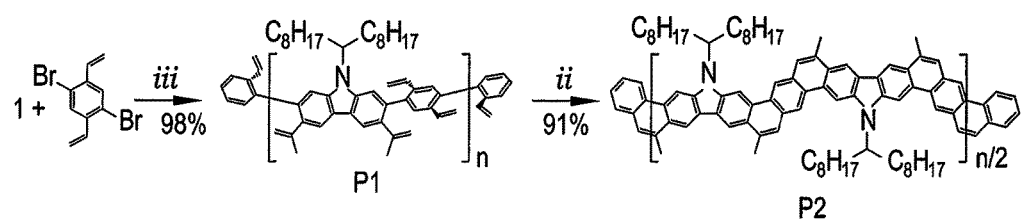
FIG. 3 is the reaction scheme for the synthesis of an organic semiconductor polymer according to the present invention.

The synthetic route to the target ladder-type polymer P2 is outlined in FIG. 3. In FIG. 3, the reaction conditions symbolized by ii include Grubbs' second generation catalyst, PhMe, reflux, 6 h, and the reaction conditions symbolized by iii include Pd(PPh$_3$)$_4$, K$_2$CO$_3$, aliquat 336, BHT, PhMe, H$_2$O, 100° C., 24 h, then 2-bromostyrene and 2-vinylphenylboronic acid. The step-growth Suzuki polymerization between precursor 1 and 1,4-dibromo-2,5-divinylbenzene afforded a conjugated polymer with pendant vinyl groups, which was then endcapped by subsequent addition of 2-bromostyrene and 2-vinylphenylboronic acid to give intermediate polymer P1, having the formula:

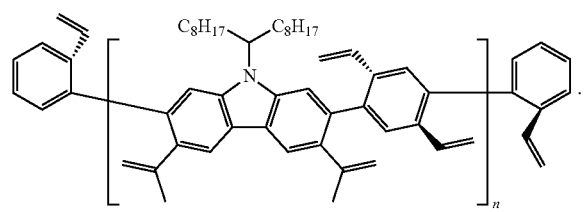

The end-capping groups not only quenched the active bromide and boronic ester functions, but also provided complementary vinyl groups for the polymer chain ends to undergo RCM reaction in the next step. BHT was added as a radical scavenger in this step to prevent vinyl cross-linking between the polymer chains. The reaction was carried out on a 1 g scale to afford P1 in 98% yield. The crude polymer was collected by precipitation from methanol, followed by washing with acetone. Further purification was accomplished using preparative size exclusion chromatography (SEC) with CHCl$_3$ as the eluent to remove the low molecular weight oligomers, affording a narrowly distributed batch of P1 in 75% isolated yield. SEC analysis of the purified P1 revealed a molecular weight (M$_n$=20 kg mol$^{-1}$, PDI=1.88) that was comparable to that of polymers used as high performance organic solar cell donor materials.

In the subsequent RCM step, the optimized conditions included adding the catalyst with a syringe pump over a period of hours at reflux temperature to convert P1 into the ladder-type product P2 in 91% yield. Testing with a similar compound had revealed that under these conditions, the conversion of the RCM reaction was close to quantitative. In this transformation, the reversible nature of RCM prevented undesired side reactions (such as intermolecular cross olefin metathesis of the vinyl groups) and afforded the thermodynamically most stable product in nearly quantitative conversion. Single crystal X-ray diffraction had shown that the crystal structure clearly demonstrated that the annulated aromatic rings extended in a coplanar geometry. The 1-octylnonyl sidechain was perpendicular to the π-backbone in the solid state. As a result, the potential strong intermolecular π-π stacking interactions were suppressed, leading to good solubility in common organic solvents, such as chloroform, tetrahydrofuran and toluene. In the present reaction, the resulting product P2 was purified by precipitation and Soxhlet extraction. The molecular weight of P2 (M$_n$=15 kg mol$^{-1}$, PDI=2.00) was slightly smaller than its precursor P1 because the higher molecular weight fraction was partially removed during these purification steps due to its lower solubility at high concentration. Despite the lower solubility of P2 compared to P1, it was still feasible to prepare a solution of purified P2 in CHCl$_3$ at a concentration of 5 mg mL$^{-1}$. This good solubility allowed for extensive NMR investigation, SEC analysis, and solution processing into thin films.

Figure 4:
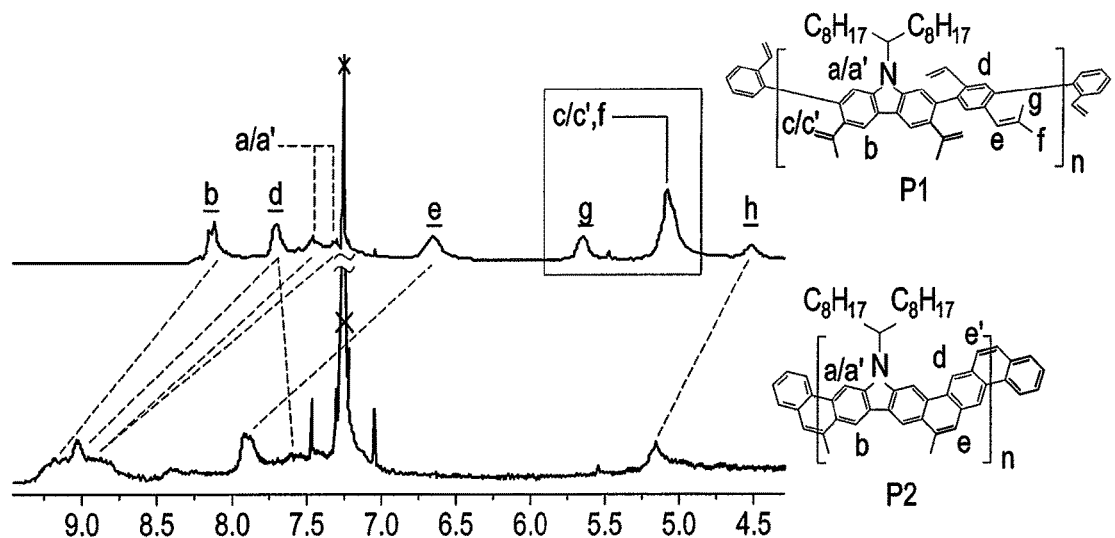
FIG. 4 is a comparison of the partial $^1$H NMR spectra of an intermediate polymer (P1) and the organic semiconductor polymer according to the present invention (P2), showing disappearance of the vinyl $^1$H resonance peaks after the ring closing metathesis.
Figure 5:
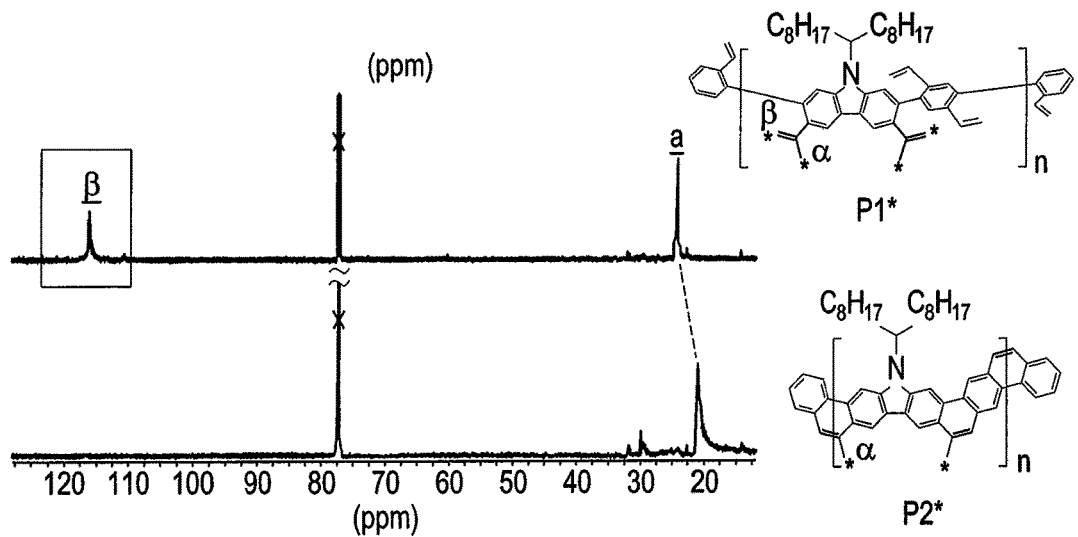
FIG. 5 is a comparison of the $^{13}$C NMR spectra of an intermediate polymer (P1) and the organic semiconductor polymer according to the present invention (P2), showing disappearance of the vinyl $^{13}$C resonance peak after the ring closing metathesis.

The comparison of $^1$H NMR spectra of P1 and P2 (see FIG. 4) showed that the resonance peaks associated with the terminal protons on the vinyl groups disappeared after RCM. In addition, IR spectra of P2 also showed the disappearance of the alkenyl C—H and C—C stretching after RCM. Despite these promising results, however, the possibility of unreacted vinyl groups in P2 could not be ruled out by these characterization methods. $^1$H NMR resonance signals were too broad to be useful for a rigorous quantification of defects, especially if the amount of unreacted vinyl groups was less than 5%. Such a structural defect, however, could be critical to the electronic, optical, and mechanical properties of conjugated ladder polymers. In this context, a $^{13}$C isotope labeling method (see FIG. 5) was employed to track the terminal vinyl carbons using much sharper $^{13}$C NMR resonance peaks. Therefore, a much more sensitive analysis of the unreacted defects of P2 could be performed. The same synthetic procedures afforded $^{13}$C labeled P1*, in which a methyl carbon α and the terminal alkenyl carbon β are 99% $^{13}$C isotope enriched. The $^{13}$C NMR spectrum of P1* showed the two expected intense sharp peaks for these $^{13}$C isotope-enriched carbons at 116.0 ppm and 24.1 ppm with good signal/noise ratio (S/N =94 after 413 scans). P1* was then subjected to the optimized RCM conditions to afford P2*. The resonance signal associated with the terminal vinyl carbon at 116.0 ppm disappeared completely, while the peak at 21.0 ppm retained an excellent signal/noise ratio (S/N=367 after 17 816 scans). This result corroborated that the unreacted vinyl defect in P2* was less than 1%. Considering that the degree of polymerization of P2 and P2* was around 23-27, the average possible defect site in a single polymer chain was, in fact, much less than one. Based on these numbers, we can conclude that most of the polymer chains should be free of defect, but there might still be a small fraction of the polymer chains possessing one or more unreacted defects.

Figure 6:
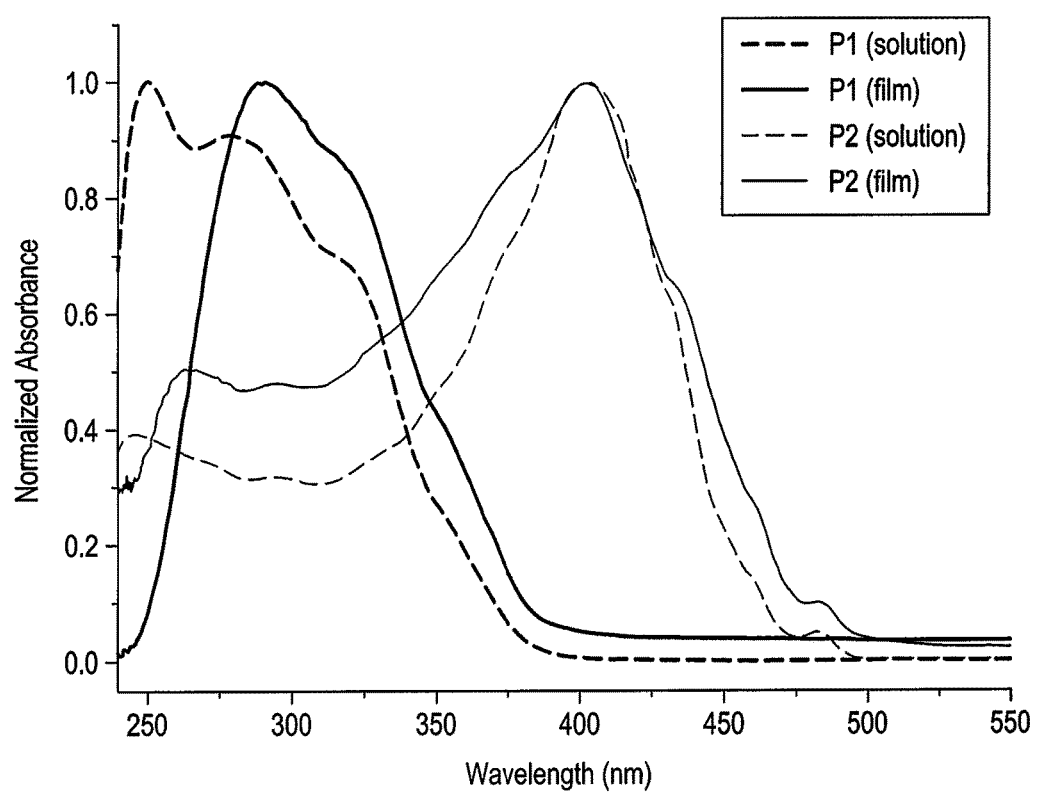
FIG. 6 is a comparison of the UV-vis absorption spectra of the intermediate polymer (P1) and the organic semiconductor polymer according to the present invention (P2), shown both in a solution off chloroform and in a thin film.
Figure 7:
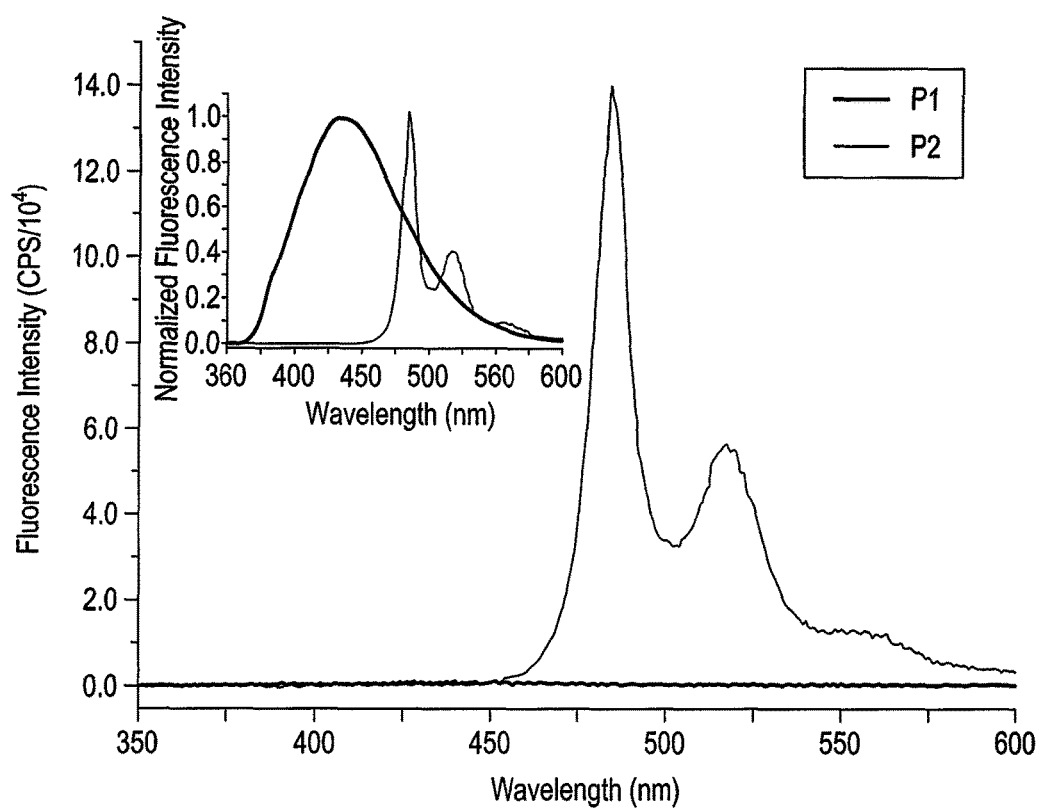
FIG. 7 is a comparison of the fluorescent emission spectrum of the intermediate polymer (P1) and the organic semiconductor polymer according to the present invention (P2) at absolute intensity in chloroform, the inset showing the same spectra at relative intensity.

UV-vis absorption and fluorescent emission spectra of P1 and P2 were recorded in $CHCl_3$ solution (see FIGS. 6 and 7). Both absorption and emission spectra of P2 were red-shifted compared to that of P1, as a result of the much more delocalized and larger conjugated π-system. In addition, HOMO-LUMO transition of P2 was weak and optically forbidden. Meanwhile, the almost zero wavelength difference between HOMO-LUMO transition of absorption and LUMO-HOMO transition of emission, as well as distinctive vibrational progression, were in accordance with the highly rigid nature of the P2 backbone, which prevented any significant conformational change between the excited and the ground states. Unlike the unstructured and low emission of P1 (quantum yield<1%), the emission spectrum of P2 was composed of well-structured vibrational progressions with much higher quantum yield (15%). Furthermore, it was observed that solid-state UV-vis absorption of P1 was red-shifted, compared to that in the solution phase. Such a red-shift can be attributed to solid-state packing-induced coplanarization of the P1 backbone, similar to that of the well-studied regioregular poly(3-alkylthiophene). In contrast, the solution-phase and solid-state absorption spectra of P2 were almost identical because P2 in solution is already coplanar and rigid; hence, solid-state packing could not change the spectra by alternating its conformation. These photophysical observations suggest that ladder polymer P2 possesses a highly rigid backbone and well extended π-conjugation.

It is expected that $sp^2$ atom-rich, aromatic ladder-type polymers have a backbone that is stable at high temperatures, resembling fused ring carbon materials, such as carbon nanotubes and graphene nanoribbons. Thermogravimetric analysis of P1 showed a clear weight loss in the range of 380-480° C., corresponding to the thermal cleavage of the $sp^a$ 1-octylnonyl side-chains. Upon further increasing the temperature, the non-ladder type backbone of P1 saw a continuous weight loss, affording only a 34% carbonization yield at 900° C. In comparison, polymer P2 also experienced a weight loss due to the alkyl chain cleavage at around 348-480° C. The remaining backbone, however, was stable up to 900° C., giving a carbonization yield of 52%. The result is in good agreement with the weight percentage of the aromatic backbone (57%). The high thermal stability of the P2 backbone is a result of its ladder-type nature and promises potential in applications as a pre-functionalized precursor for $sp^2$ carbon materials. Differential scanning calorimetric analysis of P1 showed an irreversible exothermic transition at 129° C. This transition was attributed to a thermally triggered cross-linking reaction between the vinyl groups, which converted P1 into an insoluble material after just one heating cycle. In comparison, P2 possesses a thermally stable backbone, showing no thermal transition before its side-chain cleavage temperature in the DSC measurement.

Solution processing of P2 into thin films would be a key step for future exploration of its applications. Polymeric P2 is expected to possess better processability for uniform thin films. Thin film morphologies of P2 on $SiO_2$ substrates were investigated after spin-casting or solution-shearing casting from solutions in toluene. P2 can be processed into uniform thin films by either method. No observable feature can be identified under optical microscope. Atomic force microscopy (AFM) images demonstrated an amorphous morphology with much lower roughness (RMS=0.45 nm). Grazing incidence wide angle X-ray scattering (GIWAXS) revealed no observable diffraction features for P2. These results suggest that the polymer chains were packed in an amorphous manner on $SiO_2$ substrates, despite its rigid backbone. The excellent film formation ability of P2 enables future investigation of its material properties.

In order to further characterize the solid-state dimension, conformation, and self-assembly of P2, scanning tunneling microscopic (STM) images were recorded on highly ordered pyrolytic graphite (HOPG). A solution of P2 (0.3 mg $mL^1$) in chloroform was drop-casted onto heated HOPG substrate and analyzed by STM. The images exhibited uniform and fully extended rod-like morphology, indicating self-assembly of the rigid polymer chain of P2 on the HOPG substrate. The highly ordered self-assembly was likely a result of the strong π-π interaction between the HOPG substrate and the aromatic ladder-type backbone. These rods under STM showed alternating sections of high and low signal with a periodic length at around 1.27 nm. The periodic distance between the rods under STM was around 0.7 nm, while the width of calculated polymer backbone without alkyl chain is close to 0.68 nm. Taking into consideration the additional contribution to the width from the side chains, it is likely that the neighboring P2 rods were partially stacked in a manner similar to the literature-reported graphene nanoribbons. In sharp contrast, STM analysis of P1 showed no ordered features, probably a result of low surface interaction between the non-ladder backbone and the HOPG substrate.

The synthesis of the polymers will be better understood by reference to the following Examples.

EXAMPLE 1

Synthesis of Polymer P1

To a 100 mL Schlenk flask was added precursor 1 (1.03 g, 1.40 mmol), 1,4-dibromo-2,5-divinylbenzene (0.40 g, 1.40 mmol), Pd(PPh$_3$)$_4$ (0.16 g, 10 mol %), K$_2$CO$_3$ (1.16 g, 8.40 mmol), aliquat 336 (Starks' catalyst; 0.65 mL, 0.35 mmol), and several crystals of BHT under N$_2$. Degassed toluene (40 mL) and water (8 mL) were added and further degassed 3 times by freeze-pump-thaw. The reaction mixture was stirred at 100° C. for 24 h in dark, before it was cooled down to room temperature. 2-Bromostyrene (0.77 mL, 5.60 mmol) was added into the flask, and the mixture was stirred at 100° C. for 24 h. After 24 h, 2-vinylphenyl-boronic acid (1.73 g, 11.2 mmol) was added into the flask, and the mixture was stirred at 100° C. for another 24 h. The resulting product was precipitated from methanol, filtered, and washed with acetone. The solid was dried under vacuum to afford P1 (0.84 g, 98%, $M_n$ ¼ 10 kg mol$^1$, PDI ¼ 2.78 by SEC). P1 was further purified by preparative recycling SEC to remove oligomers to afford a purified batch with higher $M_{n\,and}$ lower PDI (0.64 g, 75%, $M_n$=20 kg mol$^{-1}$, PDI=1.88 by SEC).

EXAMPLE 2

Synthesis of Polymer P2

To a 100 mL Schlenk flask was added P1 (120 mg, 0.20 mmol) and Grubbs' second generation catalyst (8 mg, 5 mol %) under N$_2$. Subsequently, degassed toluene (12 mL) was added, and the reaction mixture was stirred at reflux temperature. Immediately, another portion of Grubbs' second generation catalyst (26 mg, 15 mol %) in degassed toluene (8 mL) was added for 4 h using a syringe pump. After that, the reaction mixture was stirred for an additional 2 hours at reflux temperature before cooling down to room temperature. The resulting product was then precipitated from methanol and filtered. The product was further washed via Soxhlet extraction with acetone and hexane, before extraction with chloroform. The chloroform solution was filtered and condensed under reduced pressure. The desired product was precipitated from methanol. The precipitate was filtered and dried under vacuum to afford P2 (100 mg, 91%, $M_n$=15 kg mol$^{-1}$, PDI=2.00 by SEC).

Further description of testing and characterization of the organic semiconductor polymer and its intermediates, as well as a description of the synthesis of starting compounds, is set forth in the journal article entitled "Thermodynamic synthesis of solution processable ladder polymers", Lee et al., Chem Sci. 2016, 7, 881-889, published by the Royal Chemistry Society, which is hereby incorporated by reference in its entirety, and in the Electronic Supplementary Material (ESI) for the above-referenced article, pages S1-S39, published as DOI: 10.1039/c5sc02385h, which is hereby incorporated by reference in its entirety.

It is to be understood that the present invention is not limited to the embodiments described above, but encompasses any and all embodiments within the scope of the following claims.

We claim:

1. A method for synthesis of an organic semiconductor polymer, comprising the steps of:

polymerizing a monomer having the formula:

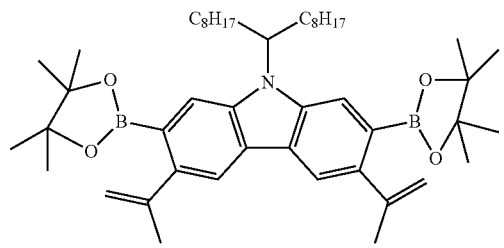

by Suzuki step growth polymerization with 1,4-dibromo-2,5-divinylbenzene to obtain an intermediate;

adding 2-bromostyrene and 2-vinyl-phenylboronic acid to the intermediate to obtain a precursor conjugated polymer having the formula:

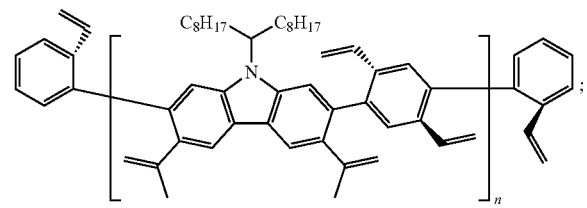

adding Grubbs' second generation catalyst to the precursor conjugated polymer to obtain a reaction mixture;

stirring the reaction mixture at reflux temperatures;

adding another portion of Grubbs' second generation catalyst to the refluxing reaction mixture by syringe pump over a period of at least four hours to obtain a raw ladder polymer by ring-closing olefin metathesis; and washing and purifying the raw ladder polymer by extraction and recrystallization to obtain the organic semiconductor polymer.

2. A conjugated ladder polymer obtained according to the method of claim 1.

3. The method for synthesis of an organic semiconductor polymer according to claim 1, further comprising the steps of:

acetylating the 3 and 6 positions of the carbazole in 2,7-dibromo-9-(1-octylnonyl)-9H-carbazole by Friedel-Crafts acylation with acetyl chloride;

converting carbonyl groups in the acetylated 3 and 6 positions to alkenes by Wittig reaction with methyltriphenylphosphonium bromide to obtain vinyl groups at the 3 and 6 positions, thereby forming an intermediate compound; and reacting the intermediate compound with 2-isopropoxy-4,4,5,5-tetramethyl-1,3,2-dioxaborolane in the presence of n-BuLi to obtain the monomer.

4. A ladder polymer, comprising a conjugated polymer having the formula:

11 12
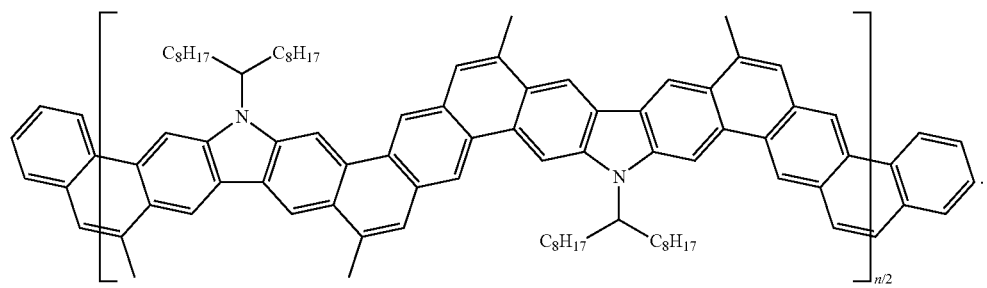
* * * * *